US006599157B2

(12) United States Patent
Pereira et al.

(10) Patent No.: US 6,599,157 B2
(45) Date of Patent: Jul. 29, 2003

(54) CIRCULAR ELECTRICAL CONNECTOR

(75) Inventors: John Pereira, Rehoboth, MA (US);
Manuel Machado, Hope, RI (US);
Stephen Antaya, West Kingston, RI (US)

(73) Assignee: Antaya Technologies Corporation, Cranston, RI (US)

( * ) Notice: Subject to any disclaimer, the term of this patent is extended or adjusted under 35 U.S.C. 154(b) by 0 days.

(21) Appl. No.: 10/209,556

(22) Filed: Jul. 30, 2002

(65) Prior Publication Data

US 2002/0187690 A1 Dec. 12, 2002

Related U.S. Application Data

(62) Division of application No. 09/847,861, filed on May 2, 2001, now Pat. No. 6,475,043, which is a continuation-in-part of application No. 09/491,135, filed on Jan. 26, 2000, now Pat. No. 6,249,966, which is a continuation of application No. 09/199,810, filed on Nov. 25, 1998, now Pat. No. 6,039,616.

(51) Int. Cl.[7] .............................................. H01B 43/04
(52) U.S. Cl. ............................. 439/876; 439/83; 29/882
(58) Field of Search .......................... 29/882; 439/876, 439/83, 874, 78

(56) References Cited

U.S. PATENT DOCUMENTS

| | | |
|---|---|---|
| 1,014,718 A | 1/1912 | Parsons |
| 3,034,202 A | 5/1962 | Graves, Jr. ................ 29/155.55 |
| 3,085,577 A | 4/1963 | Berman et al. ............. 128/418 |
| 3,103,067 A | 9/1963 | Dixon ........................ 29/473.1 |
| 3,155,808 A | 11/1964 | Wiley ......................... 206/172 |
| 3,337,947 A | 8/1967 | Terrill et al. ................... 29/475 |
| 3,621,442 A | 11/1971 | Racht et al. ................ 338/309 |
| 4,409,278 A | 10/1983 | Jochym ....................... 428/163 |
| 4,490,005 A | 12/1984 | Hovey ..................... 339/278 C |
| 4,591,401 A | 5/1986 | Neidig et al. ................. 156/89 |
| 4,645,288 A | 2/1987 | Stursa ........................ 439/876 |
| 4,782,197 A | 11/1988 | Stunzi et al. ........... 174/152 R |
| 4,785,988 A | 11/1988 | Topel et al. ................ 228/122 |
| 5,208,444 A | 5/1993 | Winter et al. ............... 219/547 |
| 5,232,383 A | 8/1993 | Barnick ...................... 439/859 |
| 5,260,549 A | 11/1993 | Garritano .................... 219/541 |
| 5,309,634 A | 5/1994 | Van Order et al. ........... 29/863 |
| 5,312,269 A | 5/1994 | Hwang ........................ 439/500 |
| 5,543,601 A | 8/1996 | Bartrug et al. .............. 219/203 |
| 5,644,830 A | 7/1997 | Ladouceur et al. ........ 29/432.2 |
| 5,713,126 A | 2/1998 | Sakemi ........................ 29/843 |
| 5,735,446 A | 4/1998 | White et al. ............. 228/114.5 |
| 5,897,406 A | 4/1999 | Benes et al. |
| 6,428,367 B1 | 8/2002 | Costa |

OTHER PUBLICATIONS

International Electrotechnical Commission, "Connectors for Frequencies Below 3 MHz (Mc/s), Part 3: Battery Connectors," Publication 130–3, Geneva, Switzerland, (First edition 1965), page on non–resilient snap–fastener connecters.

*Primary Examiner*—Gary Paumen
(74) *Attorney, Agent, or Firm*—Hamilton, Brook, Smith & Reynolds, P.C.

(57) ABSTRACT

An electrical connector includes a hollow conductive post member having a circular periphery, a foot portion and a distal end. The distal end has a generally cup shaped indentation. A base member is included having top and bottom surfaces. The foot portion of the post member is mounted to the top surface. At least one standoff extends from the bottom surface of the base member. The at least one standoff is for resting against a contact surface when soldering the electrical connector to the contact surface, thereby separating the bottom surface from the contact surface to define a minimum volume therebetween for occupation by solder.

9 Claims, 3 Drawing Sheets

CIRCULAR ELECTRICAL CONNECTOR

RELATED APPLICATIONS

This application is a divisional of U.S. application Ser. No. 09/847,861, filed May 2, 2001 now U.S. Pat. No. 6,475,043, which is a continuation-in-part of application Ser. No. 09/491,135, filed Jan. 26, 2000 now U.S. Pat. No. 6,249,966, which is a continuation of application Ser. No. 09/199,810, filed Nov. 25, 1998 now U.S. Pat. No. 6,039,616. The entire teachings of the above applications are incorporated herein by reference.

BACKGROUND

A variety of electrical connectors have been proposed in the past for numerous specific purposes. For example, electrical connectors have been proposed for use in glass, e.g., vehicle windscreens, for allowing electrical connection between electrical devices embedded in the glass and sources of power and/or other electrical devices. Windscreens often are equipped with electric heaters or defrosters which are embedded between layers which make up the windscreen, and include a simple flat electrical contact for establishing an electrical connection with the defroster. Such flat connections are typically formed by screening a conductive coating, e.g., silver, onto an exterior portion of the windscreen in which a lead from the defroster protrudes. Thus, in order to make electrical contact with the defroster, an electrical connector must be mounted onto the glass so that the connector establishes electrical communication with the flat conductive coating.

One electrical connector which has been proposed for mounting on a conductive coating of a windscreen includes an upstanding cylindrical post and a flat base which carries a layer of solder thereon. Such an electrical connector was first made available by Antaya, Inc., Cranston, R.I. The layer of solder is pressed against the contact on the windscreen, and the solder is heated to flow the solder. Pressure is simultaneously applied to the connector, which presses against the windscreen's contact. While this device has in the past proven to be useful and has advantages in certain applications, because this prior connector has a flat surface which is soldered against the flat surface of a windscreen's contact, the pressure applied when soldering tends to press or squeeze much of the solder out from under the connector. Thus, the prior connector is oftentimes mismounted to the windscreen, because most of the solder has been squeezed out from between the connector and the windscreen's contact during the soldering process. This results in connectors which cannot meet vehicle manufacturing standards for the strength of the connections between windscreens and their electrical connectors. Such mismounting of the prior electrical connectors results in a considerable amount of rework, scrap, and increases in labor time and costs to correct mismounted connectors.

A further difficulty encountered with prior electrical connectors is that they are typically very small. The size of some standard electrical connectors, including many battery connectors, makes the manufacturing processes for forming large quantities of these small connectors extremely difficult to automate. Close tolerances are also difficult to maintain during the manufacturing process, and even small changes to such a connector can necessitate complete retooling after considerable expenditures in reengineering.

SUMMARY

The present invention is directed to an electrical connector including a hollow conductive post member with a circular periphery. The post member has a foot portion and a distal end. The distal end has a generally cup shaped indentation. A base member is included having top and bottom surfaces. The foot portion of the post member is mounted to the top surface. At least one standoff extends from the bottom surface of the base member. The at least one standoff is for resting against a contact surface when soldering the electrical connector to the contact surface, thereby separating the bottom surface from the contact surface to define a minimum volume therebetween for occupation by solder.

In preferred embodiments, the distal end of the post member includes an annular ridge encircling the generally cup shaped indentation. The annular ridge has a curved peak. The post member extends from the top surface of the base member at a right angle. The generally cup shaped indentation includes a generally planar bottom wall having an opening therethrough. The opening can form a locking structure capable of engaging with a locking device of a mating connector. The at least one standoff includes four standoffs. A solder layer covers the bottom surface of the base member. The base member includes a central opening therethrough for facilitating spin soldering of the connector.

The present invention is also directed to an electrical connector system including a male connector having a hollow post member with an opening forming a locking structure. A female connector has a socket for insertion of the post member of the male connector therein. A locking device is included for extending from the female connector and is engageable with the locking structure opening of the post member of the male connector for locking the female connector to the male connector.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
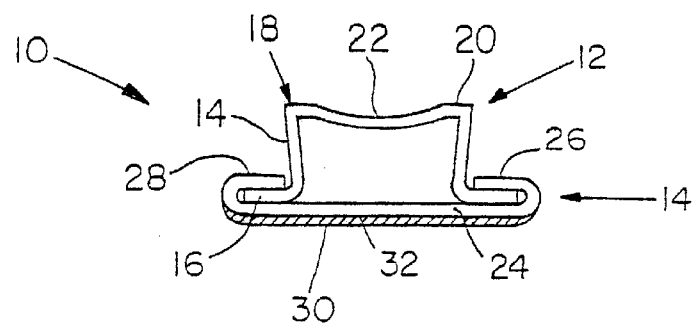
FIG. 1 is a side elevational view of a first embodiment of an electrical connector.

FIG. 1 illustrates an exemplary embodiment of an electrical connector. Electrical connector 10 includes a post member 12 and a base member 14, which are connector together to form the connector. Post member 12 includes a generally cylindrical portion 14a and a foot portion 16 which extends away from the cylindrical portion 14a. Cylindrical portion 14a extends upward from foot portion 16, and preferably angles radially outward between the foot portion 16 and a top 18. Top 18 includes a flat peripheral portion 20 adjacent to the outer edge of the top 18, and a concave, cupped inner portion 20. Foot portion 16 can be continuous and shaped as a disk (see FIG. 3), or alternatively can be formed of a plurality of individual tabs which extend away from cylindrical portion 14a and which are separated by spaces (not illustrated).

Base member 14 is generally circular and includes a bottom portion 24 and at least two tabs 26/28 which wrap around foot portion 16 of post member 12. A layer of solder 30 is provided on the lower surface 32 of bottom portion 24, so that electrical connector 10 can be soldered to a mating surface, as described in greater detail below.

Figure 2:
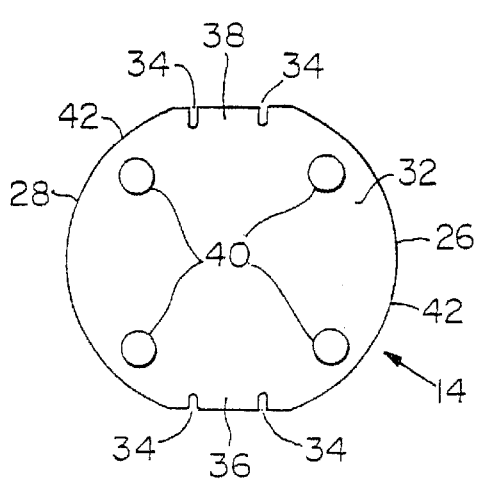
FIG. 2 is a bottom view of the electrical connector illustrated in FIG. 1.

Referring to FIG. 2, base member 14 is illustrated without solder layer 30. It is to be understood, however, that preferable embodiments of electrical connector 10 include solder layer 30. Less preferable embodiments do not include solder layer 30, and are still within the spirit and scope of the invention. FIG. 2 illustrates base member 14 having tabs 26/28, which extend into the plane of the illustration. At least two notches 34 are formed in base member 14 at the ends of tabs 26/28, and are preferably formed with curved ends so that they act to relieve stress concentrations at the ends of the tabs. In the embodiment illustrated in FIG. 2, four notches are provided. Extensions 36/38 extend from base member 14 between pairs of notches 34. Extensions 36/38 can be eliminated from base member 14, thereby leaving essentially two wider notches on base member 14.

Lower surface 32 includes at least one, preferably at least three, and more preferably four standoffs or posts 40. Standoffs 40 extend downwardly away from lower surface 32, up and out of the plane of the illustration of FIG. 2. Standoffs 40 are preferably cylindrical, can be either hollow or solid, and are preferably positioned adjacent to an outer edge 42 of base member 14. Less preferably, standoffs 40 can be located close to each other and near the center of lower surface 32.

Figure 3:
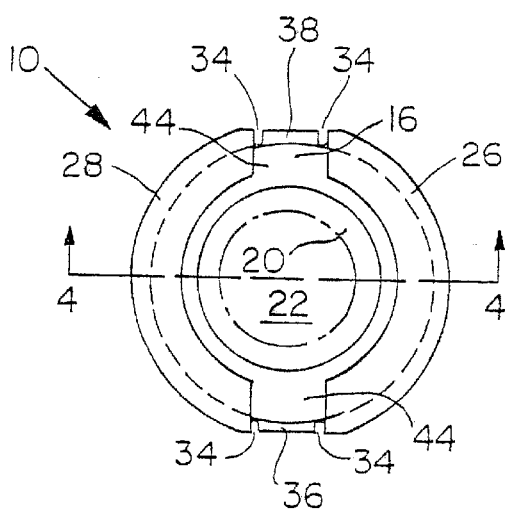
FIG. 3 is a top plan view of the electrical connector illustrated in FIG. 1.

Turning now to FIG. 3, a top plan view of connector 10 is illustrated. Two tabs 26/28 are illustrated in FIG. 3. According to yet another embodiment of electrical connector 10, three or more tabs can be provided on base member 14 which extend around foot portion 16 and which are spaced apart circumferentially. By way of example and not by limitation, three tabs can be provided on base member 14 which wrap around foot portion 16. When three tabs are provided, there will be three gaps 44 (two of which are illustrated in FIG. 3) between the three tabs, and preferably three sets of notches 34. As will be readily apparent to one of ordinary skill in the art, more than three tabs can be provided on base member 14 and still be within the spirit and scope of the invention.

Tabs 26/28 are generally crescent or "C" shaped, and are separated by gaps 44. Tabs 26/28 extend radially inward toward cylindrical portion 14 of post member 12. Tabs 26/28 can extend to cylindrical portion 14. When more than two tabs are provided, the tabs have a smaller circumferential length than tabs 26/28, as will be readily appreciated by one of ordinary skill in the art.

Figure 4:
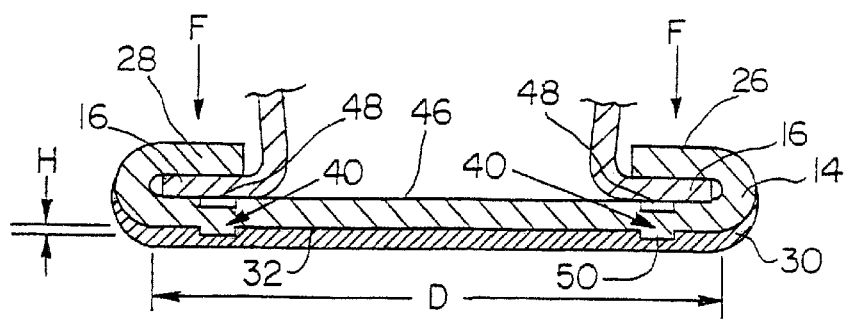
FIG. 4 is a partial cross-sectional view of the electrical connector illustrated in FIG. 1, taken along lines 4—4 in FIG. 3.

FIG. 4 illustrates a cross-sectional view of connector 10, with the upper portions of post member 12 broken away, taken along lines 4—4 in FIG. 3. Base member 14 has a top surface 46, which includes dimples or recesses 48. Recesses 48 are formed in top surface 46 when standoffs 40 are formed by stamping base member 14 to deform the base member to create the standoffs, and therefore recesses 48 are artifacts of the stamping process. Recesses 48 perform an additional function in base member 14 by acting as a stress concentrator in the base member. Recesses 48 can therefore assist in assuring that tabs 26/28 wrap around foot portion 16 without causing buckling or binding of base member 14 when the tabs are wrapped around the foot portion. When standoffs 40 are formed by a process which does not involve deforming base member 14, recesses 48 can be eliminated, for example, by forming the standoffs with a small rivet or the like.

Standoffs 40 each have substantially the same height H, measured from their bottom surfaces 50 to lower surface 32, and base member 14 has a diameter D defined as the largest linear distance across the lower surface. Because tabs 26/28 curve up from base member 14, diameter D is slightly smaller than the distance between the edges of tabs 26/28 described above with reference to FIG. 2. Height H and diameter D therefore together define a minimum volume V below lower surface 32, the value of which is computed from the formula:

$$V=(\pi/4)\cdot H\cdot D^2$$

Thus, for a particular diameter D, and therefore size of connector 10, the height H of standoffs 40 determines the volume V.

Volume V is filled with solder 30, which preferably covers standoffs 40 so that there is solder in excess of that necessary to fill volume V. Height H, and therefore volume V of solder 30, is selected so that electrical connector 10 will bond to a mating surface with a preselected strength, which is a function of the volume V of solder which connects the electrical connector to the mating surface. Standoffs 40 ensure that no less than volume V of solder 30 is available for joining connector 10 with a mating surface to which the connector is soldered.

A process of using electrical connector 10 will now be described with reference to FIGS. 1–4. Electrical connector 10, preferably with a layer of solder 30 covering standoffs 40, is placed on a mating surface (not illustrated) so that the layer rests flat against the mating surface. According to one preferred embodiment of the present invention, the mating surface is a glass surface, e.g., a piece of automobile glass in which an electrical device is embedded, and the glass surface includes an electrically conductive coating, e.g., a silver coating, to form an electrical connection with connector 10. With connector 10 resting on the mating surface, a soldering device (not illustrated) is pressed against the connector, e.g., against post portion 12, tabs 26/28, or both, with a force F. Because foot portion 16 extends under tabs 26/28 and is connected to post portion 12, force F is transmitted through connector 10 in the region above standoffs 40, and through the solder layer. As will be readily appreciated by one of ordinary skill in the art, the soldering device also heats solder layer 30 to a temperature at which it becomes liquified. The combined effect of force F and the liquid state of heated solder layer 30 is to bond the liquified solder to the mating surface and lower surface 32 of base member 14, including standoffs 40. Standoffs 40, however, prevent force F from pressing lower surface 32 against the mating surface, and therefore leaves at least volume V of liquified solder 30 to hold connector 10 to the mating surface.

Standoffs 40 also function to maintain base member 14 in a generally planar shape while force F presses connector 10 against the mating surface. By locating standoffs 40 in the area under foot portion 16 and tabs 26/28, which is the same area through which force F is transmitted through connector 10, the standoffs transmit all of force F (albeit at a higher pressure) once lower surface 50 has been exposed by liquified solder 32 having flowed away from the standoffs. By requiring all of force F to be transmitted through tabs 26/28, foot portion 16, and standoffs 40 at this stage of the soldering process, the portion of base member 14 between the standoffs bears little or no load, and therefore base member 14 will not be bent by force F. Thus, standoffs 40 maintain the planar shape of base member 14 during soldering, which further ensures that connector 10 will be uniformly soldered to the mating surface.

In accordance with a preferred embodiment of connector 10, the diameter of top 18 is about 5.72 mm; the distance between edges 26/28 is about 8.90 mm; the distance between the lower surface of solder layer 32 and the upper surface of tabs 26/28 is about 1.35 mm; the distance between the upper surface of tabs 26/28 and top 18 is about 3 mm; the distance from the center of base member 14 to the center of each standoff is about 3.4 mm; each height H is between about 0.05 mm and about 0.15 mm, preferably about 0.1 mm; post member 12 is formed of 70/30 brass of about 0.016 inch thickness; base member 14 is formed of 70/30 brass of about 0.012 inch thickness; solder layer 30 is about 0.013 inch thick and formed of 25% Sn, 62% Pb, 10% Bi, and 3% Ag, and solder layer 30 includes a flux coating. Furthermore, post portion 12 conforms to the International Electro Technical Commission ISO standard for battery connectors type 17, miniature non-resilient snap-fastener connectors, and the combination of the height H of standoffs 40, the particular solder chosen, and the effective diameter D of the base member results in electrical connector 10, when soldered onto a silver-coated windscreen, having a pull-strength of at least about 80 pounds.

Figure 5:
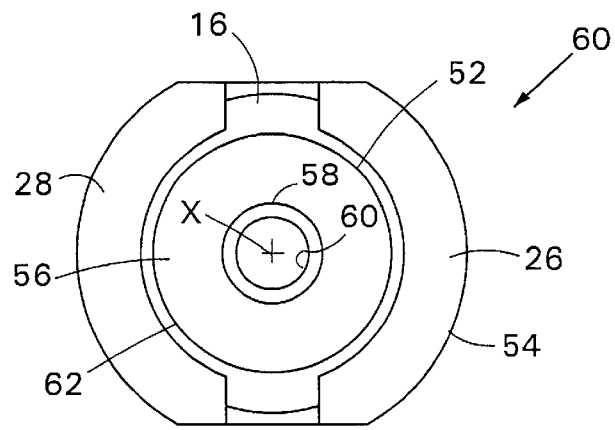
FIG. 5 is a top view of another embodiment of the present invention electrical connector.
Figure 6:
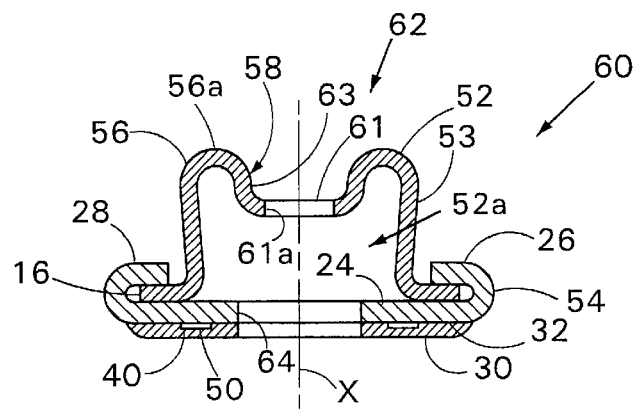
FIG. 6 is a sectional view of the embodiment of FIG. 5.
Figure 7:
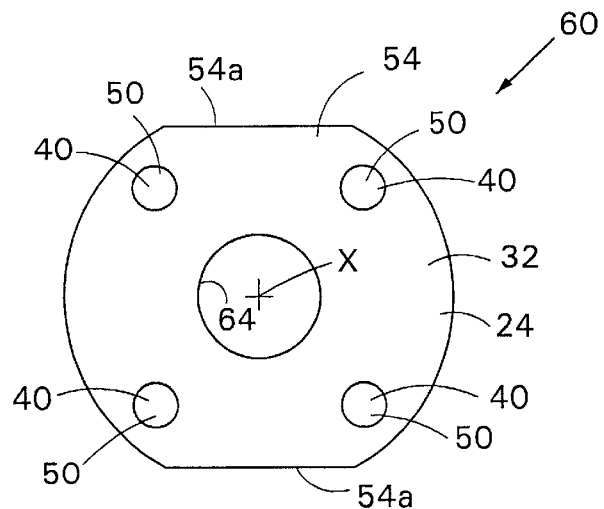
FIG. 7 is a bottom view of the embodiment of FIG. 5 with the layer of solder omitted for clarity.

Referring to FIGS. 5–7, electrical connector 60 is another embodiment of the present invention. Electrical connector 60 is a male connector that includes a base member 54 and a post member 52. Base member 54 is similar to base member 14 of electrical connector 10 but differs in that a central opening 64 is formed therethrough to facilitate the melting of solder 30 during spin soldering. In spin soldering, electrical connector 60 is held in a chuck and rotated while pressed against the surface for soldering to until the solder 30 heats up from friction and melts. Removal of material along the central axis X of base member 54 removes the area of base member 54 that would have zero rotational velocity during spin soldering and therefore generate little or no heat from friction. Base member 54 also has two flats 54a instead of the notches 34 and extensions 36/38 of base member 14. As with the base member 14, base member 54 includes standoffs 40 having a lower surface 50 and a layer of solder 30 on the lower surface 32 of bottom portion 24. The central opening 64 makes the base member 54 and the layer of solder 30 generally annular in shape. Furthermore, base member 34 includes tabs 26/28 for wrapping around the foot portion 16 of post member 52 to secure the post member 52 to the base member 54.

Post member 52 is hollow with a generally circular perimeter or periphery and an outwardly tapering side wall 53 extending upwardly from foot portion 16. Post member 52 also has a distal end 62 which includes an annular ridge 56 having a curved peak 56a. The annular ridge 56 encircles a generally cup shaped indentation 58 which is shown as being generally cylindrical. Indentation 58 has a generally planar horizontal bottom wall 61 with a hole 61a extending therethrough along central axis X into the hollow interior 52a of post member 52. A cylindrical side wall 63 connects the bottom wall 61 with the annular ridge 56. Although side wall 63 is shown as generally cylindrical, side wall 63 may alternatively be generally sloped or curved. The cross section of post member 52 through the cup shaped indentation 58 is generally annular in shape while the cross section of post member 52 through the portion between the indentation 58 and the foot portion 16 is generally circular in shape. The annular ridge 56 and indentation 58 provide the distal end 62 with rigidity and strength to prevent crushing thereof during normal use.

In one embodiment, base member 54 is 8.6 mm in diameter and flats 54a are 8.2 mm apart. Central opening 62 of base member 54 is about 3 mm in diameter. Post member 52 extends 3 mm±0.1 above the tabs 26/28 of base member 54. The diameter of post member 52 is 5.72 mm±0.05. The annular ridge 56 is about 1.8 mm wide and the curved peak 56a has a radius of about 0.9 mm. The bottom wall 61 of indentation 58 is about 1.3 mm below peak 56a. Indentation 58 has a diameter of about 2.12 mm. The bottom wall 61 and the cylindrical side wall 63 of indentation 58 are joined together by a radius of about 0.38 mm. Hole 61a in bottom wall 61 is about 1.8 mm in diameter. Electrical connector 60 is made of 70/30 brass with base 54 being 0.012±0.001 inches (0.3±0.025 mm) thick and post member 52 being 0.016±0.001 inches (0.4±0.025 mm) thick. Solder layer 30 is similar to that in electrical connector 10. The base member 54 and post member 52 are preferably formed by separate dies and assembled together by a third die.

Figure 8:
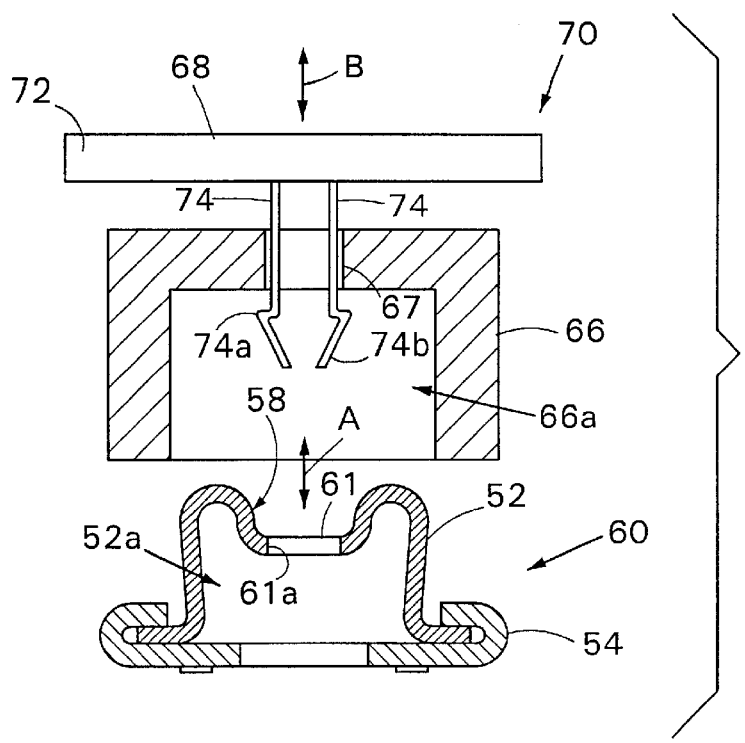
FIG. 8 is a view of a female connector having a locking device positioned for mating with the electrical connector of FIG. 5.

Referring to FIG. 8, electrical connector 60 is typically engaged with a socket 66 of a female electrical connector 70. Arrows A indicate that connectors 60/70 are engageable and disengageable from each other. Socket 66 can be any one of a number of different female sockets and is schematically shown as being generally cup shaped with an interior 66a. When post member 52 of electrical connector 60 is engaged within interior 66a of the socket 66 of female electrical connector 70, post member 52 comes in electrical contact with socket 66 in a manner similar to that when electrical connector 10 is engaged therein. The female electrical connector 70 can optionally include a locking device 68 for locking the electrical connectors 60/70 together.

In the embodiment shown in FIG. 8, locking device 68 includes a button 72 having two or more resilient prongs 74 extending into the interior 66a of socket 66 through an opening 67 in socket 66. Prongs 74 have outwardly directed locking protrusions 74a, and tips 74b which inwardly angle forwardly towards each other. Locking device 68 is operable in the direction of arrows B. To lock electrical connector 60 within socket 66, the user pushes button 72 towards socket 66 which moves the angled tips 74b of prongs 74 further into the interior 66a of socket 66 and into the hole 61a within the post member 52 of electrical connector 60. The angled tips 74b engage the hole 61a, and as the tips 74b progress therethrough, the angled surfaces of the tips 74b bend prongs 74 inwardly and force the tips 74b towards each other. Bending the prongs 74 inwardly brings the locking protrusions 74a closer together allowing them to pass through hole 61a. Once locking protrusions 74a reach the interior 52a of the post member 52 of electrical connector 60, the locking protrusions 74a engage the bottom wall 61 of indentation 58, thereby trapping or capturing bottom wall 61 to provide locking thereof and preventing easy removal of post member 52 from socket 66. In this manner, the bottom wall 61, and the hole or opening 61a therethrough, form a locking structure. Locking device 68 may be disengaged from post member 52 by pulling on button 72 to pull prongs 74 from the hole 61a in post member 52.

Figure 9:
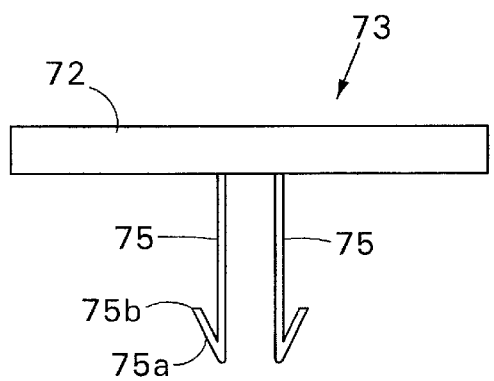
FIG. 9 is another embodiment of a locking device.

Referring to FIG. 9, locking device 73 is another embodiment of a locking device which differs from locking device 68 in that prongs 75 have rearwardly and outwardly angled portions 75a terminating in tips 75b. The tips 75b, when engaged with post member 52, trap or capture bottom wall 61.

Figure 10:
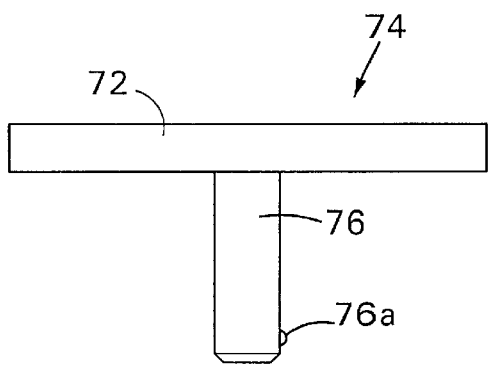
FIG. 10 is yet another embodiment of a locking device.

Referring to FIG. 10, locking device 74 is yet another embodiment of a locking device which includes a protrusion 76 for engaging hole 61a within the indentation 58 of post member 52. Protrusion 76 has a spring loaded ball 76a for trapping bottom wall 61. Although locking devices 68, 73 and 74 have been shown to be movably engageble relative to socket 66, alternatively, the locking portions of locking devices 68, 73 and 74 can be incorporated as part of the socket 66 to lock the post member 52 of electrical connector 60 with female connector 70 instantly upon engagement.

Figure 11:
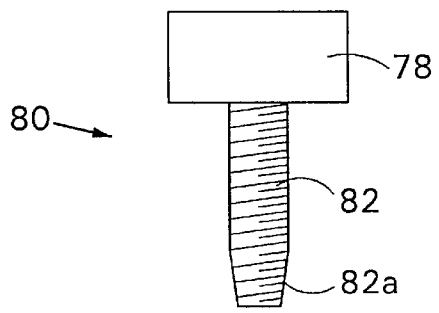
FIG. 11 is still another embodiment of a locking device.

Referring to FIG. 11, locking device 80 is still another embodiment of a locking device which includes a knob 78 for turning a threaded locking screw 82. The threaded locking screw 82 engages the hole 61a within the indentation 58 of post member 52 for locking the electrical connector 60 within the socket 66 of female connector 70. Locking screw 82 has a tapered tip 82a which facilitates engagement with hole 61a.

While this invention has been particularly shown and described with references to preferred embodiments thereof, it will be understood by those skilled in the art that various changes in form and details may be made therein without departing from the scope of the invention encompassed by the appended claims. For example, features of the different embodiments described above can be combined or omitted. In addition, although particular materials and dimensions have been described above, it is understood that such parameters can be varied depending upon the application at hand. Furthermore, although the present invention has been described in a particular orientation with particular directional terminology, it is understood that the connectors can be oriented in any direction since the orientation of the connectors is dependent upon the application at hand.

What is claimed is:

1. A method of forming an electrical connector comprising:

forming a hollow conductive post member with a circular periphery, the post member including a foot portion and a distal end, the distal end having a generally cup shaped indentation;

mounting the foot portion of the post member to a base member, the base member having top and bottom surfaces, the foot portion being mounted to the top surface; and extending at least one standoff from the bottom surface of the base member, the at least one standoff for resting against a contact surface when soldering the electrical connector to the contact surface, thereby separating the bottom surface from the contact surface to define a minimum volume therebetween for occupation by solder.

2. The method of claim 1 further comprising forming the distal end of the post member with an annular ridge encircling the generally cup shaped indentation.

3. The method of claim 2 further comprising forming the generally cup shaped indentation with a generally planar bottom wall, the bottom wall having an opening therethrough.

4. The method of claim 3 further comprising forming the opening as a locking structure capable of engaging with a locking device of a mating connector.

5. The method of claim 2 further comprising forming the annular ridge with a curved peak.

6. The method of claim 1 further comprising forming the base member with four standoffs.

7. The method of claim 1 further comprising forming a solder layer on the bottom surface of the base member.

8. The method of claim 7 further comprising forming a central opening through the base member for facilitating spin soldering of the connector.

9. The method of claim 1 further comprising extending the post member from the top surface of the base member at a right angle.

* * * * *